United States Patent [19]

Shindo et al.

[11] Patent Number: 4,534,840
[45] Date of Patent: Aug. 13, 1985

[54] METHOD FOR FORMING A COMPOUND SEMICONDUCTOR FILM

[75] Inventors: Masanari Shindo, Hachioji; Shigeru Sato, Hino; Akinari Kaneko, Hachioji, all of Japan

[73] Assignee: Konishiroku Photo Industry Co., Ltd., Japan

[21] Appl. No.: 532,758

[22] Filed: Sep. 16, 1983

[30] Foreign Application Priority Data

Sep. 27, 1982 [JP] Japan .................................. 57-168101

[51] Int. Cl.³ ............................................. C23C 15/00
[52] U.S. Cl. ........................... 204/192 R; 204/192 N; 204/192 SP; 204/192 C; 204/298; 427/86
[58] Field of Search ............. 204/298, 192 N, 192 SP, 204/192 C, 192 R; 427/86

[56] References Cited

U.S. PATENT DOCUMENTS

| | | | |
|---|---|---|---|
| 4,321,246 | 3/1982 | Sarma et al. | 427/86 |
| 4,362,632 | 12/1982 | Jacob | 204/298 |
| 4,365,013 | 12/1982 | Ishioka | 204/192 P |
| 4,377,628 | 3/1983 | Ishioka | 204/192 P |

OTHER PUBLICATIONS

Behrisch et al., Chem. Abstracts 85 (1976), #152552.
Takada et al., Chem. Abstracts 94 (1981), #148928.
Weber et al., J. Electrochem Soc., 1982, pp. 2022-2028.

*Primary Examiner*—Arthur P. Demers
*Attorney, Agent, or Firm*—Finnegan, Henderson, Farabow, Garrett & Dunner

[57] ABSTRACT

In the case of forming a single-layered or multilayered compound semiconductor film such as a GaAs thin film for a semiconductor laser, an EL light-emission element and the like in a molecular beam epitaxis method, a vacuum deposition method or a sputtering method, the method of the invention is to prevent the compounds from deteriorating and decomposing by making activated hydrogen coexist therein.

10 Claims, 6 Drawing Figures

METHOD FOR FORMING A COMPOUND SEMICONDUCTOR FILM

BACKGROUND OF THE INVENTION

The present invention relates to a method for forming a compound semiconductor film which is usable for a luminous element, solar battery, photosensor, such as a semiconductor laser, light-emission diode, electroluminesence (hereinafter called EL), and the like.

There have already been known such compound semiconductors as light-emission diodes, semiconductor lasers, and the like, for example, a GaAs thin film which, by the application of electric field thereto, converts electric energy to light energy.

A method for forming such a GaAs thin film includes a liquid phase growth method which comprises crystal growth from a component containing liquid phase directly on a substrate, and a gaseous phase growth method which comprises a reaction gas decomposition on a substrate to thereby deposit such a thin film thereon. However, the liquid phase growth method has the disadvantage that the temperature control for forming a liquid phase is difficult (therefore the film thickness control is difficult), and since a fusing agent is added to the phase, it is difficult to obtain a highly pure thin film. The gaseous phase growth method is also disadvantageous because due to the resultant decomposed product of a volatile compound and the unreacted gas no highly pure thin film is obtained and it is difficult to control the film thickness and the impurity doping. Besides, from the process engineering point of view, in both methods, there is a serious disadvantage in that it is impossible to uniformly form a thin film over a large area, so that these methods are not applicable to an industrial scale production.

On the other hand, there exist the following methods: the molecular beam epitaxis method which comprises evaporating a thin layer-forming material at a low rate under a ultra-high vacuum condition (e.g., $10^{-10}$ Torr) to attach onto a substrate to epitaxially grow thereon; the vacuum deposition method which comprises heating a component vapor source to evaporate the component into a vacuum space to deposit it on a substrate; the sputtering method which comprises causing charged heavy particles such as $Ar^+$ ions to collide with a target consisting of a thin film-forming material to sputter the material therefrom and attaching it onto a substrate; and other equivalent methods.

In the above three methods a thin film-forming material evaporates without decomposing for deposition on a substrate, and they are fundamentally different from the foregoing gaseous growth method. These methods have the following advantages: In the molecular beam epitaxis method there occurs little contamination during the layer formation because of its high vacuum condition, and if necessary, the structure and the material of a semiconductor crystal can be changed. However, because this method requires a large scale, expensive apparatus, a vacuum deposition method or a sputtering method, whose apparatus structure is simple and inexpensive, is more advantageous from the standpoint of process engineering. However, it has now been found that even such vacuum deposition and sputtering methods have the following problems: Because the vacuum deposition method is normally operated under a vacuum condition of from $10^{-3}$ to $10^{-7}$ Torr and because the sputtering method is operated under a vacuum condition wherein the partial pressure of such an inert gas as Ar is of the order of from $10^{-1}$ to $10^{-3}$ Torr, The semiconductor crystal grows in an atmosphere with a relativey high concentration of residual gases (impurities) such as oxygen, carbon, etc., and in addition the film surface tends to react with these residual gases. Consequently, increasing the contamination in the crystal structure is unavoidable. For this reason, despite the excellent process engineering merits any practically satisfactory film quality has still not been obtained in the methods.

SUMMARY OF THE INVENTION

The present invention has been made in consideration of such circumstances, and an object of the present invention is to provide a method capable of forming a thin film with a high production efficiency, the thin layer being excellent in the crystallinity as well as in the purity and suitably usable for, e.g., light-emission diodes, semiconductor lasers, transistors, diodes, hall elements, photodetectors, photo-ICs, solar batteries, and EL elements.

This object is accomplished by the method of the present invention, i.e., a method for forming a compound semiconductor film comprising a vacuum deposition method for forming a compound semiconductor film comprising depositing compound semiconductor film forming materials on a substrate in the presence of activated hydrogen so as to remove harmful gases.

According to the present invention, in a chamber filled with ionized or activated hydrogen gas (hereinafter, the gas whose energy level is raised to increase the reactivity is reffered to as "activated gas") a compound semiconductor film forming materials, without being accompanied by the ionization or activation thereof (i.e., the characteristics of the materials are kept substantially unchanged) is evaporated by an appropriate means toward a substrate to be deposited thereon to thereby form a compound semiconductor film excellent in the characteristics necessary to serve as a material for luminous elements such as light-emission diodes, EL elements, and the like. Accordingly, the harmful impurities (contaminants) such as oxygen, carbon, nitrogen, etc., present in the space in which the compound semiconductor film-forming materials evaporate, react with the activated hydrogen to thereby become harmless and are removed by and through an exhaust system, so that the contaminants, even where a relatively large amount thereof is present inside the chamber, may be removed to the extent that the remainder causes substantially no hindrance to the practical film formation. As a result, even if the material and the construction of the chamber and the exhaust system were symplified to reduce the costs, a semiconductor film having a high purity and satisfactory crystallinity can be formed. For example, even if a normal exhaust system (a combination of a diffusion pump with a rotary pump) were used, when the gas exhaust is set with a back pressure of from $10^{-7}$ to $10^{-6}$ Torr, a satisfactory compound semiconductor could be obtained, and the time required for the gas exhaust can be reduced to 1-3 hours.

On the other hand, when unactivated hydrogen gas is used, the above-described removal effect of the harmful gas can hardly be expected because the unactivated hydrogen gas has poor reactivity with the harmful gas component, and is not capable of effectively preventing the contamination in the formed compound semiconductor film.

In the method of the present invention, film-forming materials evaporate in the space inside the chamber without the decomposition and deposit on a substrate to thereby form a thin film. Therefore a material of high-purity can be used compared to the one used in the gaseous phase growth method or liquid phase growth method. Further, crystal growth rate remarkably increases, so that the method is deemed to be significantly more efficient as well producing better film quality. Accordingly, the method of the invention is particularly suitable for manufacturing EL elements and the like having a low-cost and a wide area.

The compound semiconductor film to be formed by the method of the present invention may be variously selected. For example, those compound semiconductor film forming materials having the component combination of the periodic table's Group III-Group V (e.g., Ga-As), Group II-Group VI (e.g., Cd-Te, Zn-S) or Group IV-Group VI (e.g., ph-Te) may be deposited. And mixed crystals of these such as $Ga_xAl_{1-x}As$, $ZnSe_x\text{-}Te_{1-x}$, $pb_xSn_{1-x}Te$, and the like, may be used.

In other words, the method of the invention can be applied to forming the semiconductor film of not only a binary or ternary compound but also a pluralistic compound.

Further, as a matter of course, the semiconductor film of the described compounds can also be constituted as a multilayered semiconductor layer of different compounds within the scope of the invention by the repeated application of the method of the invention.

In addition, as for the substrates onto which a compound semiconductor layer is deposited, single crystal plates of GaAs, silicon or the like, besides glass plates being generally used, can be used.

DETAILED DESCRIPTION OF THE INVENTION

Figure 1:
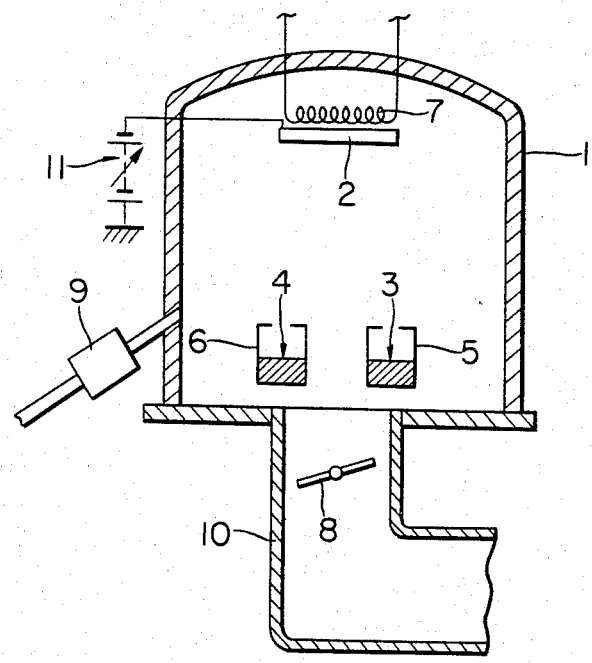
FIG. 1 is a schematic sectional view of a vacuum deposition apparatus for use in the formation of a GaAs thin film by the vacuum deposition method.

As the method for forming a compound semiconductor thin film in this invention, the molecular beam epitaxis method, vacuum deposition method, sputtering method, and the like, may be used, and as the way of letting activated hydrogen be present inside the deposition chamber in the above methods, various modes thereof may be used.

For example, there may be used, as the activated hydrogen producing source, a hydrogen discharge tube as described in Japanese Patent Publication Open to Public Inspection (hereinafter called Japanese Pat. O.P.I. Publication) No. 78414/1981, which we had earlier proposed, a RF gas discharger (RF ion gun) as described in Japanese Patent O.P.I. Publication No. 70522/1983, a magnetron-type gas discharger (DC ion gun) as described in Japanese Patent O.P.I. Publication No. 112045/1983, and the like. Any of these can be provided in or outside the chamber, so as to preferably direct the activated hydrogen into the chamber toward the surface of a substrate.

Alternatively, such a thermoelectron generator as described in Japanese Patent Application No. 89287/1982 may be used to generate thermoelectron, and the thermoelectron is emitted to irradiate the surface of a substrate in the presence of hydrogen gas to thereby activate the hydrogen gas.

In the case of forming a thin film in accordance with the method of the present invention, the amount of activated hydrogen or hydrogen to be activated introduced into the chamber is very important for accomplishing the object of the present invention, and the amount introduced, when the exhausting speed of the exhaust system is from 100 liters/min. to 10,000 liters/min., should be in a hydrogen flow of from 5 ml/min. to 500 ml/min., and preferably from 10 ml/min. to 200 ml/min. When the flow is less than 5 ml/min., the contaminents are not removed sufficiently, and it is difficult to form a compound semiconductor having good quality, and when the flow is more than 500 ml, the lattice defects of the semiconductor crystal increase, resulting in the deterioration of the crystallinity.

In addition, the vacuum deposition method utilized in the present invention includes the Rf ion plating method as described in Japanese Patent O.P.I. Publication No. 162275/1980, which we had earlier proposed, the DC ion plating method as described in Japanese Patent O.P.I. Publication No. 13776/1981, the vacuum deposition method as described in Japanese Patent O.P.I. Publication No. 78413/1981, the deposition method as described in Japanese Patent publication Open to Public Inspection No. 104477/1981, and the like.

As the sputtering method, ordinary sputtering apparatus or magnetron sputtering apparatus as described in Japanese Patent O.P.I. Publication No. 55328/1983, and the like, may be used.

The molecular beam epitaxis method is as described in, e.g., the Appl. Phys. Lett. 33(12), Dec. 15, 1978.

The method for forming a GaAs thin film (particularly for light-emission diodes) in which a vacuum deposition method is used will be illustrated below in reference to examples of the present invention.

In FIG. 1, a substrate 2 is arranged in the upper part inside a bell jar 1, and Knudsen cell type deposition sources 5, 6 (made from boron nitride) are arranged in the lower part inside the bell jar 1. Ga 3 is put in Knudsen cell 5 and As 4 in Knudsen cell 6. The inside of bell jar 1 is connected through an exhaust path 10 having a butterfly valve 8 to a vacuum pump (not shown) to thereby exhaust the air at an exhausting rate of from 100 liters/min. to 10,000 liters/min. so that the inside of bell jar 1 is under a vacuum condition of from $10^{-5}$ to $10^{-7}$ Torr. With introducing activated hydrogen gas into the thus air-exhausting bell jar 1 by means of a hydrogen gas discharge tube 9 at a flow rate of from 10 ml/min. to 200 ml/min. and directing it to substrate 2, substrate 2 is heated by heater 7 to about 400° to 800° C., and Ga 3 and As 4 are heated to evaporate their vapors toward substrate 2, thereby forming a GaAs film on the substrate. The activated hydrogen gas should be supplied so that the vacuum condition inside bell jar 1 is maintained from $10^{-4}$ Torr to $10^{-5}$ Torr. In order to avoid method (without use of activated hydrogen) in Table 1.

TABLE 1

|  | This invention Vacuum deposition | Comparative examples | |
|---|---|---|---|
|  |  | Ordinary deposition | Molecular beam epitaxis |
| Hydrogen discharge tube | Used (discharge 600 V, 0.6 A) | Not used | Not used |
| Gas pressure | $5 \times 10^{-5}$ Torr (hydrogen pressure), provided back pressure is $8 \times 10^{-7}$ Torr | $8 \times 10^{-7}$ Torr | $5 \times 10^{-10}$ Torr |
| Vapor source | Ga, As (Knudsen cell type) | Ga, As (Knudsen cell type) | Ga, As (Knudsen cell type) |
| Temperature of substrate | 700° C. (GaAs substrate) | 700° C. (GaAs substrate) | 700° C. (GaAs substrate) |
| Growth rate | 1 μm/2 hrs. | 1 μm/2 hrs. | 1 μm/2 hrs. |
| Photoluminescence ratio (room temp.) | 70 | 1 | 70 |
| Cleavage plane | Uniform | Many streaks appear on the growing surface at about 60° C. to deteriorate crystallinity | Uniform |
| Exhaust time | 2 hrs. | 2 hrs. | 20 hrs. | hydrogen being incorporated into the deposited film, the temperature of the substrate should be maintained from 200° to 1000° C. The higher the temperature, the better the hydrogen is prevented from being incorporated into the deposited film.

Figure 2:
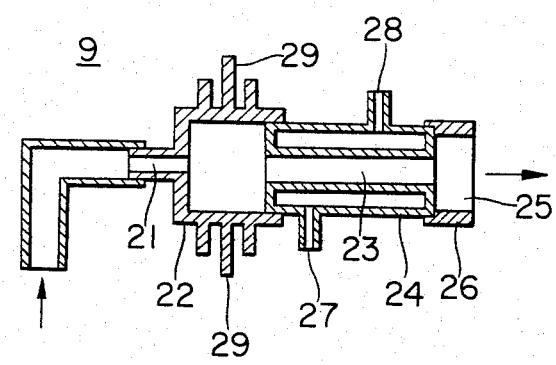
FIG. 2 is a sectional view of a hydrogen gas discharge tube, which introduces activated hydrogen gas into a vacuum deposition apparatus.

For example, the temperature of substrate 2 is set at 700° C., and with exhausting the air at 1000 liters/min., the hydrogen activated by hydrogen gas discharge tube 9 (to which is applied a voltage of 1000 V DC) is introduced at a rate of 80 ml/min. toward substrate 2 (which is applied a voltage of −600 V), and the Ga and As are heated to evaporate, thereby forming a GaAs thin film of about 1 μm. The activated hydrogen is effectively attracted by and to the negatively charged substrate 2, so that the effect of preventing contamination in the deposited film becomes sufficient. The foregoing hydrogen gas discharge tube used is as shown in FIG. 2, which comprises a cylindrical electrode member 22 having a gas inlet 21, a cylindrical discharge spacing member 24, made of, e.g., glass surrounding a discharge space 23, an electrode member 26 which is provided at the other end of the discharge spacing member 24 and which has a gas outlet 25. A DC or AC voltage is applied to between the electrode member 22 and 26 to thereby cause a glow discharge of the hydrogen gas supplied through gas inlet 21 in the discharge space 23, whereby the activated hydrogen and hydrogen ions are exhausted from outlet 25.

The discharge spacing member 24 is of a double-tube structure so as to allow cooling water to pass therethrough. In the drawing, 27 and 28 are the inlet and the outlet, respectively, for cooling water. 29 is a cooling fin of the electrode member 22. The distance between the electrodes of the above hydrogen gas discharge tube 9 is from 10 to 15 cm, and applicable voltage to the discharge tube is from 500 to 800 V and the pressure inside discharge space 23 is about $10^{-2}$ Torr.

The method of heating Ga and As sources may be any one, such as, e.g., resistance heating, induction heating, electron gun heating, and the like.

Next, an example of depositing GaAs in the vacuum deposition method in accordance with the present inventin is shown in comparison with the molecular beam epitaxis method and an ordinary vacuum deposition From the above results, it is understood that the GaAs film in accordance with the present invention not only is excellent in the photoluminescence but has as much uniform crystallinity as that obtained by the molecular beam epitaxis method. And the exhaust time required in the method of the present invention is short, and the film can be formed under a normal vacuum condition. When the above vacuum deposition method is performed in the non-activated hydrogen atmosphere, the results obtained cannot be more than those of the ordinary deposition method.

Figure 3:
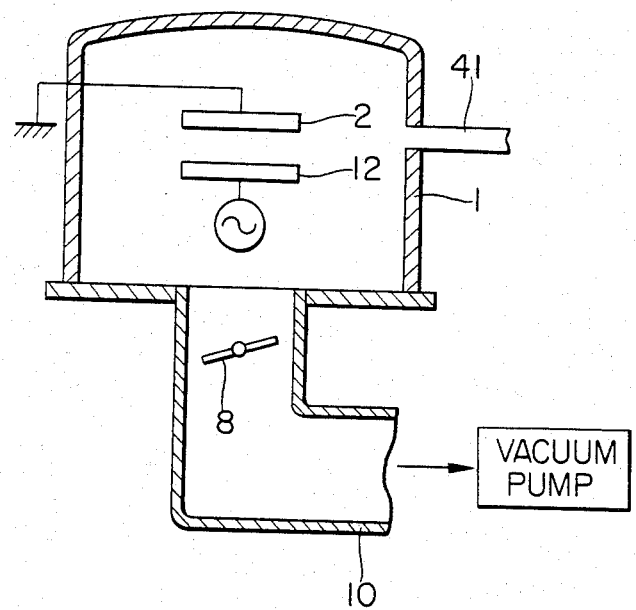
FIG. 3 is a schematic sectional view of a ZnS thin film forming apparatus utilizing an ordinary RF sputtering device.

As another examples of this invention, a ZnS layer (particularly for EL) was formed in accordance with the sputtering method as illustrated below:

FIG. 3 shows a sputtering apparatus. In a bell jar 1, a grounded substrate 2 and ZnS plate 12 to which is applied a high-frequency voltage are arranged, and under the condition that a glow discharge by a high-frequency voltage is produced therebetween, a gaseous mixture of argon and unactivated hydrogen is supplied from conduction pipe 41 (if necessary, hydrogen is allowed to be conducted into the bell jar from a different pipe). This is called Rf sputtering. The argon ionized by the above discharge strikes Zn 12, a target, and the expelled target metal is deposited on a proximate substrate 2. In this instance, the supplied hydrogen also is automatically activated by the discharge to display the same effect as has been described in the preceding example, and thus a desired ZnS layer can be formed on substrate 2. Target 12 may be of a mixture with Mn as an activator or may be provided thereon with Mn.

In addition, D.C. sputtering may be used instead of the Rf sputtering of FIG. 3.

Figure 4:
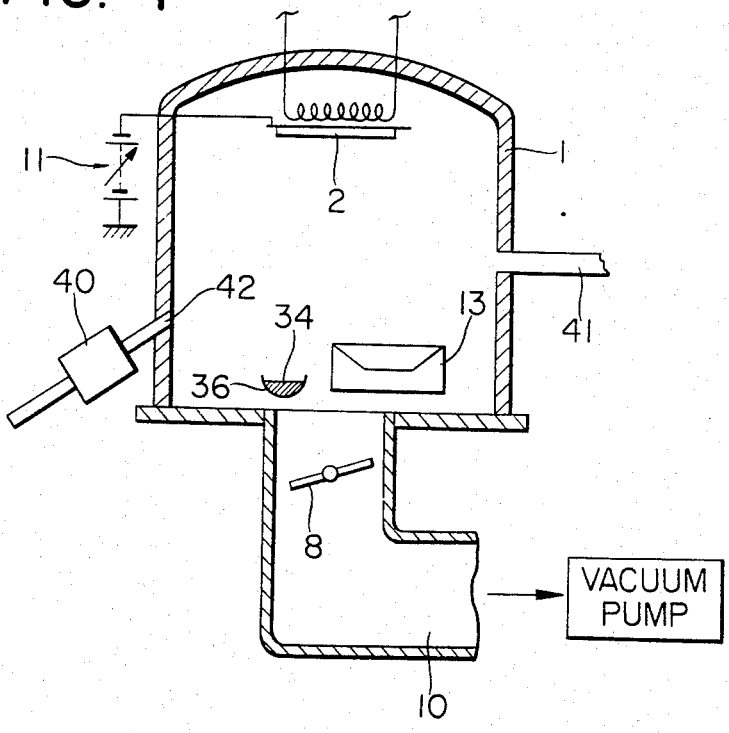
FIG. 4 is a schematic sectional view of a ZnS thin film forming apparatus using a magnetron sputtering device.

In FIG. 4, a bell jar 1 is connected through an exhaust path 3 having a butterfly valve 8 to a vacuum pump (not shown), and air is exhausted at from 100 liters to 10,000 liters per minute to make the inside of bell jar 1 in a vacuum condition of from $10^{-5}$ to $10^{-7}$ Torr. With heating substrate 2 to 400°–600° C. by heater 7, the hydrogen activated by an Rf ion gun 40 (shown in FIG. 5) or unactivated hydrogen (to be activated after introduction) at a rate of from 5 ml to 500 ml per minute, and preferably from 10 ml to 200 ml per minute, and argon gas from a different conduction pipe 41 are introduced into the bell jar so that the partial pressure becomes approximately $10^{31}$ 1 to $10^{-3}$ Torr. With conducting these gases into the bell jar, a magnetron sputtering device 13 having cathode target composed of ZnS arranged inside the bell jar 1 so as to face opposite to substrate 2 is acted to thereby form a ZnS thin film on substrate 2. Mn as an activator may be either mixed into the target material (ZnS) or placed on the target.

Figure 6:
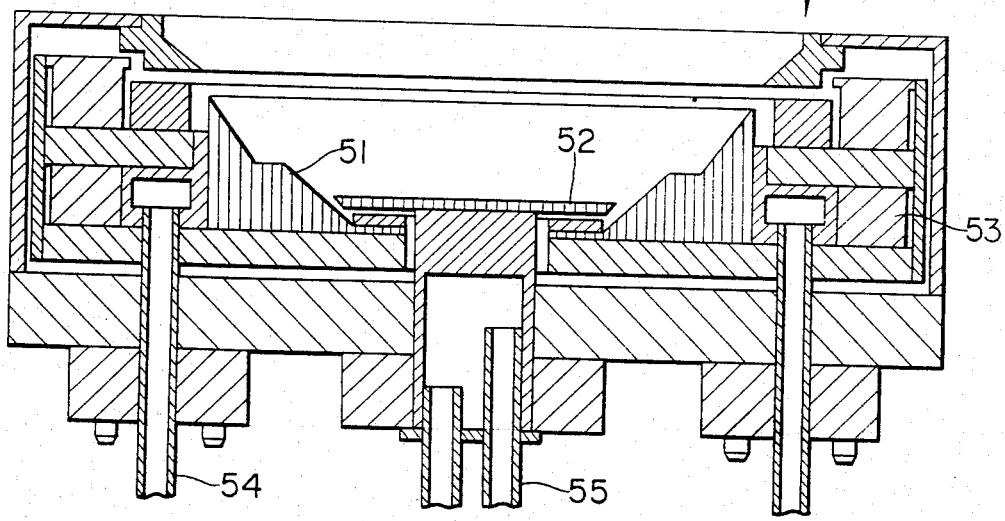
FIG. 6 is a sectional view of the magnetron sputtering device.

The magnetron sputtering device 13 used herein, as shown in FIG. 6, comprises a cathode target 51 whose internal surface is conically extended open outward, an anode plate 52 arranged at the center of the bottom of the cathode target 51, and a permanent magnet 53 arranged so as to surround and further to back from behind the cathode target 51. The plasma caused by glow-discharge between cathodic target 51 and anode target 52 by the application of high-frequency voltage or a DC voltage thereto becomes bound around cathodic target 51 by the magnetic force of permanent magnet 53, and as a result the argon ion densely present in the plasma drives at a high efficiency the ZnS particles out of the cathodic target 51, and also with the aid of the action of the magnetic field of permanent magnet 53, a highly efficient sputtering is performed in the space formed by the extension of the internal peripheral surface of cathodic target 51. To be concrete, "S-Gun" manufactured by Varian Corp. (U.S.) may be a preferred example.

Figure 5:
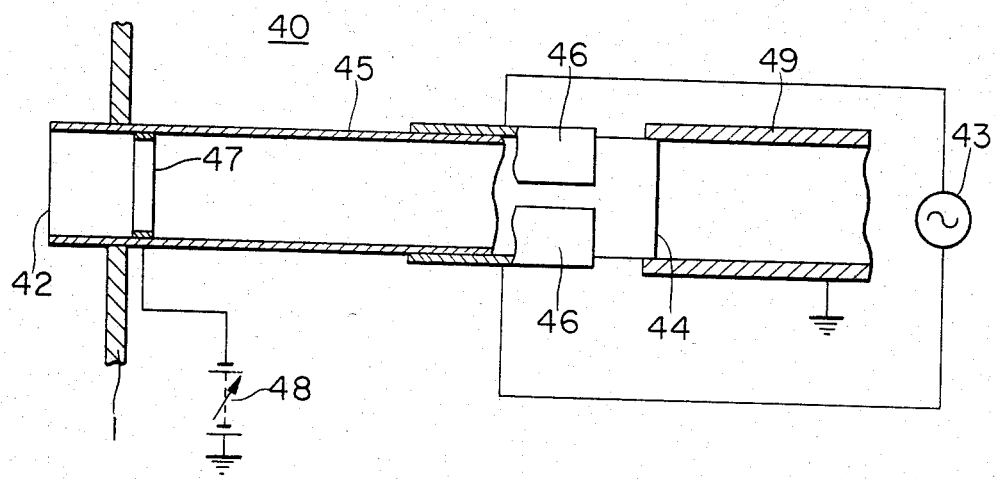
FIG. 5 is a sectional view of an RF gas discharge tube, which is equipped with an RF ion gun.

In addition, the Rf gas discharge tube used herein is as shown in FIG. 5, which comprises a discharge space surrounding member 45 composed of a glass tube having at one end thereof an activated hydrogen releasing outlet 42 and at the other end thereof a hydrogen gas inlet 44, a pair of arc-curved electrode plates 46 arranged separately from each other around the periphery of the member 45, a high-frequency power source 43 for applying a high-frequency voltage to the electrode plates 46, and a grounded metallic tube 49 which is connected to the member 45. The outlet 42 is so connected to the bell jar 1 as to face toward the substrate 2. 47 is a draw-out electrode which is provided in the proximity of the outlet 42, wherein as the high-frequency power source 43, one with a frequency of, e.g., 13.56 Hz is used, and to the electrode 47 is applied a DC negative voltage of from 10 to 800 V from power source 48. In addition, the member 45 usually has a cooling water flow unit, but omitted from the drawing.

The results are described below: In the apparatus shown in FIG. 4, the air inside bell jar 1 is removed at an exhausting rate of 1000 liters per minute to make a vacuum condition of $10^{-6}$ Torr, quartz glass substrate 2 is heated by heater 7 up to 500° C., and to the substrate is applied 500 V by DC power source 11. For the Rf gas discharge tube 40, with the supply thereto of hydrogen gas at a flow rate of 20 ml per minute, a high-frequency voltage of 13.56 MHz is applied to electrode 46 and a DC voltage of $-600$ V to draw-out electrode 47 to thereby cause a gas discharge. As argon gas is conducted through conduction pipe 41 into bell jar 1 so that the partial pressure becomes $10^{-2}$ Torr, a high-frequency voltage is applied to between the cathodic target 51 and anode plate 52 of magnetron sputters S-Gun 50 provided with cathodic target 51 composed of ZnS to thereby operate the apparatus. Thus, the sputtering of ZnS is performed over a period of one hour, thereby forming a 5000 Å-thick ZnS thin layer on substrate 2.

The thus obtained ZnS thin layer, as shown in Table 2, is excellent in the photoluminescence as compared to those obtained by the conventional sputtering method, and is useful as an optical element.

TABLE 2

|  | Sputtering of the Invention | Comparative Sputtering |
|---|---|---|
| Target | ZnS Mn (small piece on the target) | ZnS Mn (small piece on the target) |
| Gas pressure | Ar $10^{-2}$ Torr $H_2$ 5 × $10^{-3}$ Torr Back pressure 8 × $10^{-7}$ Torr | Ar $10^{-2}$ Torr Back pressure 8 × $10^{-7}$ Torr |
| Temperature of substrate | 500° C. | 500° C. |
| Growth rate | 5000 Å/1 hr. | 5000 Å/1 hr. |
| Photoluminescence intensity ratio | 2 | 1 |
| Exhaust time | 2 hrs. | 2 hrs. |

In addition, the above vacuum deposition is advantageous in respect of the crystallinity of the deposited film. The crystallinity is allowed to be polycrystalline. For the purity of the film, the sputtering method is rather useful. In the sputtering method, the appropriate conduction ratio of activated hydrogen to Ar is 1-99 atomic %. The increase in hydrogen lowers the sputtering rate, but improves the prevention effect of the mixing of the residual gas components into the deposited layer.

And in the case of the sputtering of ZnS by magentron sputtering device 13 in FIG. 4, Mn, Tb, or the like, which can be the luminous center of EL element and the like is heated to be evaporated as the evaporating material 34 of vapor source 36, and is deposited on substrate 2, whereby a remarkably high-performance luminous element can be obtained.

Examples of the present invention has been described in above, but the examples are allowed to be variously modified in accordance with the technical concept of the present invention, and such modifications include, for example, modifications made according to a purpose of using, such as pluralistic compound semiconductor film constitutions, different compound semiconductor multilayer constitutions and the like.

What is claimed is:

1. A vacuum deposition method for forming a compound semiconductor film comprising, depositing compound semiconductor film forming materials on a substrate in the presence of sufficient ionized hydrogen to react with impurities.

2. The method for forming a compound semiconductor film of claim 1, wherein said compound semiconductor film forming materials are selected from the group consisting of compounds in combination of the periodic table's Groups III-V, Groups II-VI and Groups IV-VI.

3. The method for forming a compound semiconductor film of claim 1, wherein said compound semiconductor film forming materials are deposited on the substrate in accordance with a method selected from the group consisting of a molecular beam epitaxis method, a vacuum deposition method, and a sputtering method.

4. The method for forming a compound semiconductor film of claim 2, wherein said compound semiconductor film forming materials are deposited on the substrate in accordance with a method selected from the group consisting of a molecular beam epitaxis method, a vacuum deposition method, and a sputtering method.

5. The method for forming a compound semiconductor film of claim 1, wherein a multilayered compound semiconductor film of different compounds is formed by repeated application of the method.

6. The method for forming a compound semiconductor film of claim 2, wherein a multilayered compound semiconductor film of different compounds is formed by repeated application of the method.

7. The method for forming a compound semiconductor film of claim 1, wherein the film for an EL element is formed by the method selected from the group consisting of a vacuum deposition method and a sputtering method.

8. The method for forming a compound semiconductor film of claim 2, wherein the film for an EL element is formed by the method selected from the group consisting of a vacuum deposition method and a sputtering method.

9. The method for forming a compound semiconductor film of claim 1, wherein said substrate is maintained at a temperature of from about 200° C. to 1000° C.

10. The method for forming a compound semiconductor film of claim 1, wherein said product of the reaction of said impurities and said ionized hydrogen is removed from a chamber in which the reaction takes place.

* * * * *